United States Patent
Philipp et al.

(10) Patent No.: US 10,073,163 B2
(45) Date of Patent: Sep. 11, 2018

(54) CONTROL DEVICE

(71) Applicant: Hella KGaA Hueck & Co., Lippstadt (DE)

(72) Inventors: Dietmar Philipp, Erwitte (DE); Christian Sievers, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 345 days.

(21) Appl. No.: 14/710,017

(22) Filed: May 12, 2015

(65) Prior Publication Data
US 2015/0331087 A1 Nov. 19, 2015

(30) Foreign Application Priority Data
May 15, 2014 (DE) .................. 10 2014 106 840

(51) Int. Cl.
*H01R 13/52* (2006.01)
*G01S 7/02* (2006.01)
*H05K 5/00* (2006.01)
*H05K 5/02* (2006.01)
*G01S 13/93* (2006.01)
*H01Q 1/42* (2006.01)

(52) U.S. Cl.
CPC .............. *G01S 7/02* (2013.01); *G01S 13/931* (2013.01); *H01Q 1/42* (2013.01); *H05K 5/0008* (2013.01); *H05K 5/0052* (2013.01); *H05K 5/0056* (2013.01); *H05K 5/0069* (2013.01); *H05K 5/0204* (2013.01); *G01S 2007/027* (2013.01)

(58) Field of Classification Search
CPC .... G01S 7/02; G01S 13/931; G01S 2007/027; G01S 7/032; H01Q 1/42; H05K 5/0008; H05K 5/0052; H05K 5/0069; H05K 5/0204; H05K 5/068; H05K 5/0047; H05K 5/0026; H05K 3/202; H05K 5/6275; H02K 5/225; H01R 9/16; H01R 13/6275; H01R 12/58; H01R 13/5213; H01R 13/5202; H01R 31/02; H01R 13/52
USPC ........................................................ 342/175
See application file for complete search history.

(56) References Cited

U.S. PATENT DOCUMENTS 5,079,672 A * 1/1992 Haubner ............... H01L 25/16
                     165/185
5,392,197 A * 2/1995 Cuntz ................... H05K 5/0047
                     174/377

(Continued)

FOREIGN PATENT DOCUMENTS

DE    19500436 A1 * 9/1995 ......... H01R 13/5202
DE    19500436 A1 * 9/1995 ......... H01R 13/5202

(Continued)

*Primary Examiner* — Timothy A Brainard
*Assistant Examiner* — Nuzhat Pervin
(74) *Attorney, Agent, or Firm* — Husch Blackwell LLP

(57) ABSTRACT

The invention relates to a control device which has a housing with a housing base and a housing cover In the housing, a circuit board with electronic components has been arranged in the housing, which, furthermore, has a plug connection element with a connector housing. The connector housing has been arranged on the housing base, and in the housing base an opening has been arranged, which is covered by the connector housing and penetrated by connection elements of the plug connection element. A pressure compensation element has been arranged in the connector housing.

14 Claims, 2 Drawing Sheets

(56) References Cited

U.S. PATENT DOCUMENTS

| | | | | |
|---|---|---|---|---|
| 5,739,463 | A | * | 4/1998 | Diaz .................... H05K 5/0039 |
| | | | | 174/378 |
| 6,037,894 | A | * | 3/2000 | Pfizenmaier ............ G01S 7/032 |
| | | | | 342/128 |
| 6,600,103 | B1 | * | 7/2003 | Schmidt .................. G01S 7/032 |
| | | | | 174/559 |
| 6,674,412 | B1 | * | 1/2004 | Schmidt .................. H01Q 1/42 |
| | | | | 342/70 |
| 6,683,789 | B1 | * | 1/2004 | Sheynis ............... H05K 5/0069 |
| | | | | 361/752 |
| 2002/0062714 | A1 | * | 5/2002 | Albert ................ F16H 61/0009 |
| | | | | 74/606 R |
| 2012/0294571 | A1 | * | 11/2012 | Kappla .............. H01R 13/6275 |
| | | | | 385/76 |
| 2013/0069427 | A1 | * | 3/2013 | Nowotnick ............ H05K 3/202 |
| | | | | 307/10.1 |
| 2015/0064963 | A1 | * | 3/2015 | Gerullis ............. H01R 13/5213 |
| | | | | 439/521 |
| 2015/0077959 | A1 | * | 3/2015 | Loibl ..................... H01R 12/58 |
| | | | | 361/760 |
| 2015/0326093 | A1 | * | 11/2015 | Olsen ..................... H02K 5/225 |
| | | | | 417/423.7 |

FOREIGN PATENT DOCUMENTS

| | | | | | |
|---|---|---|---|---|---|
| DE | | 19615015 | A1 | * | 10/1997 ............ H01R 31/02 |
| DE | | 19615015 | A1 | * | 10/1997 ............ H01R 31/02 |
| DE | | 10028198 | A1 | * | 4/2001 ............ H01R 13/52 |
| DE | | 10028198 | A1 | * | 4/2001 ............ H01R 13/52 |
| DE | | 102006006554 | | * | 8/2007 ............... H01R 9/16 |
| DE | | 102006053114 | A1 | * | 5/2008 ........... H05K 5/0026 |
| DE | | 102006053114 | A1 | * | 5/2008 ........... H05K 5/0026 |

\* cited by examiner

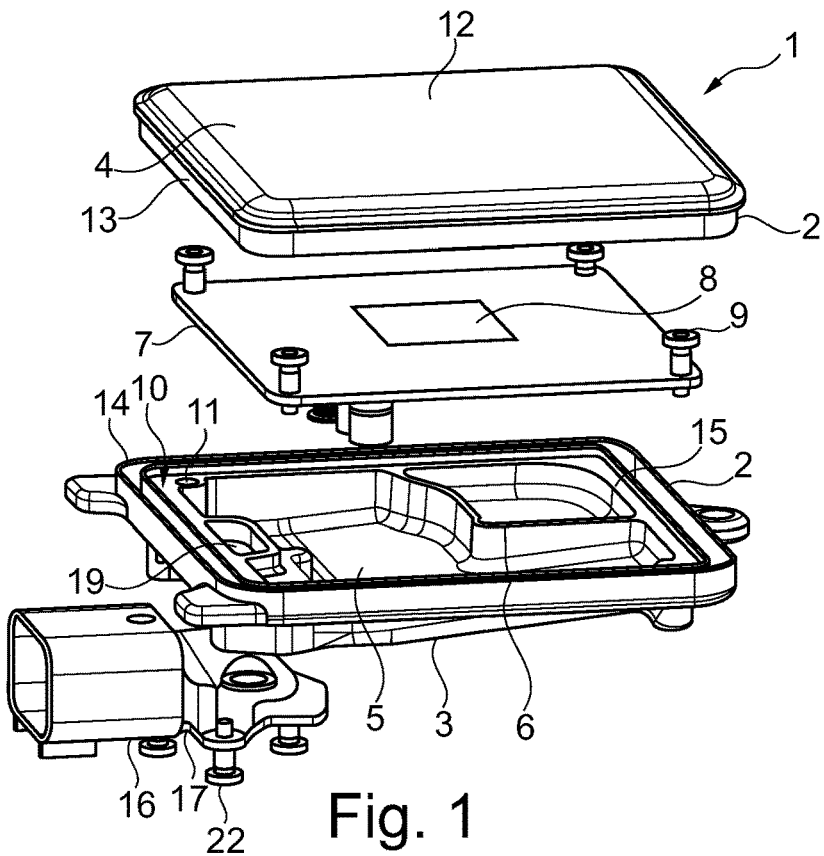
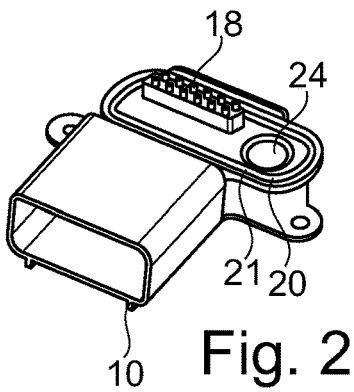
Fig. 2
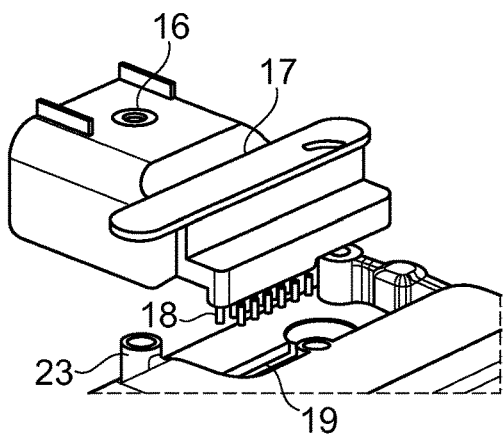
Fig. 3
Fig. 1

CONTROL DEVICE

CROSS REFERENCE

This application claims priority to German Application No. 10 2014 106840.8, filed May 15, 2014, which is hereby incorporated by reference.

FIELD OF TECHNOLOGY

The invention relates to a control device, in particular a sensor assembly or a radar sensor, especially for a motor vehicle.

BACKGROUND

Radar sensors are used more and more frequently in motor vehicles. For example, such radar sensors are used driver assistance systems in order to be able to recognize oncoming vehicles already from a larger distance and in order to be able to determine as precisely as possible their position and speed. Radar sensors are used also to monitor the immediate surroundings of the motor vehicle.

For this purpose, the radar sensors are mounted on the body of the vehicle, behind the bumper or in the engine space. Therefore, they are protected against external influences by means of a housing with a radome.

At the same time, the housing consists of aluminum, which results in improved EMC shielding, wherein a plug has to be mounted to the housing so as to be able to connect the electronics of the radar sensor in the housing from the outside. Furthermore, because of the stable aluminum housing and the heat generated in the housing a pressure compensation element has been provided in the housing, which has a membrane for providing the pressure compensation. The radome used as housing cover for the housing is mostly transparent for microwave radiation and is manufactured, for example, of plastic material.

In plastic housings, the material of the housing in itself does not ensure the EMC shielding. For this purpose, metallic coatings or interior housings are required, which involve a complex and cost-intensive assembly.

SUMMARY OF THE INVENTION

It is therefore the object of the present invention to provide an improved control device in comparison to prior art which, at the same time, ensures sufficient EMC protection and secure pressure compensation.

One embodiment of the invention relates to a control device, which has a housing with a housing base and a housing cover, wherein a circuit board with electronic components is arranged in the housing, which, furthermore, has a plug connection element with a connector housing, wherein the connector housing has been arranged on the housing base and in the housing base an opening has been arranged, which is covered by the connector housing and penetrated by connection elements of the plug connection element, wherein a pressure compensation element has been arranged in the connector housing. As a result, the housing can be designed in such a way that it fulfills the requirement with regard to EMC protection and the plug connection element assumes the electrical contact and the pressure compensation so that the respective component is optimized for its respective purpose.

According to the invention, it is of special advantage when the housing base consists of metal, for example, aluminum or aluminum alloy. This will result in the desired stability and perfect EMC protection.

It is also advantageous when the housing cover, in particular the randome, consists of plastic material. Plastic material has the advantageous property of being mostly transparent for microwave radiation. In addition, plastic material can be manufactured in a cost-effective manner.

It is also advantageous when the connector housing consists of plastic material. It can be designed in a simple and cost-effective manner and the pressure compensation element can be easily integrated.

At the same time, it is advantageous when the connector housing is mounted to the housing base, for example, screwed, riveted, welded or glued to the housing base. This can result in a secure and permanent connection. When using the method of screwing or riveting, a repair can be performed with a non-destructive detachment.

It is also practical when the connector housing and/or the housing base comprise a gasket receiver for receiving a gasket by means of which the connector housing is tightly mounted to the housing base. As a result, the interior space of the housing can be protected in such a way that no dirt or water can penetrate the interface between housing and connector housing.

At the same time, it is advantageous when the gasket is designed in the form of an axial seal or radial seal.

It is also advantageous when the pressure compensation element is designed in the form of an opening arranged in the connector housing and covered by a membrane. As a result, the membrane can compensate the pressure, as well as seal the interior space of the housing.

It is of special advantage when the membrane is mounted to the connector housing by means of ultrasonic welding or gluing. In this way, it is possible to attain a simple and tight connection in the area of the pressure compensation element.

Furthermore, it is advantageous when the circuit board is arranged to be mounted to the housing base, for example, screwed, riveted, welded or glued to the housing base. As a result, the circuit board can be arranged in a permanently secure and vibration-free manner. This protects the service life of the control device, in particular the radar sensor.

In addition, it is of advantage when the housing cover is arranged to be tightly mounted to the housing base, for example, screwed, riveted, welded or glued to the housing base.

BRIEF DESCRIPTION OF THE DRAWINGS

Reference is now made more particularly to the drawings, which illustrate the best presently known mode of carrying out the invention and wherein similar reference characters indicate the same parts throughout the views.

FIG. 1 is a perspective exploded diagram of the invention-based radar sensor used as an example for a control device, FIG. 2 is a perspective presentation of a plug connection element, FIG. 3 is a presentation of the housing of the control device, having a connector housing at the bottom.

DETAILED DESCRIPTION OF THE DRAWINGS

Figure 4:
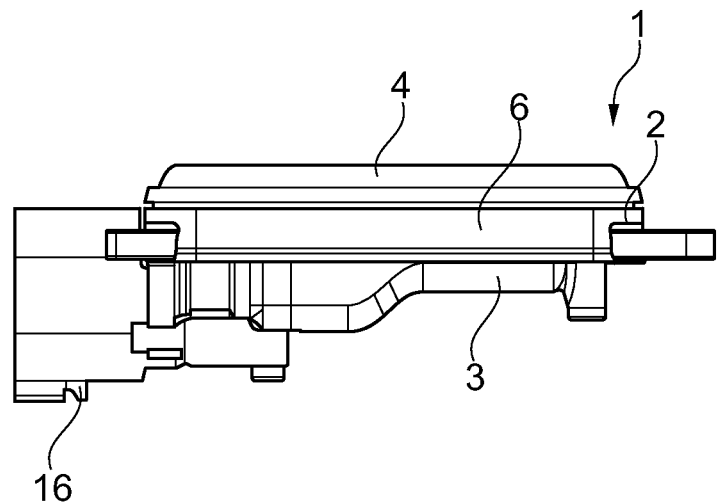
FIG. 4 is a schematic lateral view of the control device.

FIG. 1 shows a perspective exploded diagram of a control device 1 with a housing 2. The housing 2 consists of a housing base 3 and a housing cover 4. At the same time, the housing base 3 is shaped in the form of a basin, having a base 5 and a circumferential raised edge 6. In the housing, a circuit board 7, especially a sensor board, has been arranged, in which electronic components and/or antenna elements 8 are arranged. Screws 9 are used to connect the circuit board 7 with the housing base 3. For this purpose, the circuit board 7 rests on a circumferential section 10 of the raised edge 6, to which also the screw holes 11 are attached.

The housing cover 4 covers the interior space of the housing 2. For this purpose, the housing cover 4 has a planar surface area 12 and a circumferential raised edge 13, which engages in a circumferential groove 14 of the edge 6 of the housing base 3. At the same time, the housing cover 4 can be designed in the form of a randome.

Furthermore, the control device comprises a plug connection element 16 with a connector housing 17. The connector housing 17 is arranged on the bottom side of the housing base 3. For this purpose, the upper side of the plug connection element 16 comprises electrical contacts 18, which penetrate an opening 19 in the housing base 3. Around the contacts 18 the plug connection element 16 comprises a circumferential gasket 20, which is arranged in a receiver 21 and which seals the opening 19 to the outside when the plug connection element 16 is placed and screwed on the housing base. For this purpose, the screws 22 have been provided which are screwed into screw holes 23 of the housing base 3.

Furthermore, the plug connection element 16 comprises a pressure compensation element 24. This pressure compensation element is designed in the form of an opening which is covered by a membrane. Advantageously, the membrane is designed in such a way that it is connected to the connector housing 17 by means of ultrasound welding or gluing.

According to the invention, the housing base 3 consists of metal, for example, aluminum or aluminum alloy. At the same time, the housing cover 4 consists of plastic material. In the embodiment, the connector housing 17 consists of plastic material.

Figure 5:
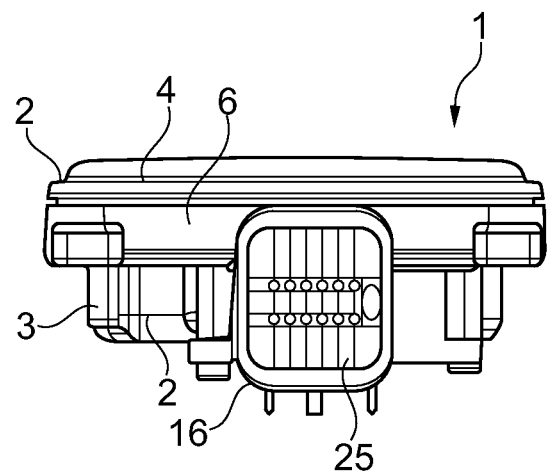
FIG. 5 is a further lateral view of the control device.

In FIGS. 4 and 5 the control device 1 is shown in a respective lateral view. The housing base 3 of the housing 2 comprises an approximately rectangular base with a raised edge 6 on which the housing cover 4 is placed. On the bottom side the plug connection element 16 is mounted to the housing base 3, resulting in the fact that the plug connection element 16 protrudes laterally and a plug can be inserted from the side into the plug receiver 25.

According to the above-mentioned description, the connector housing 17 is screwed to the housing base 3. Alternatively, the connector housing 17 can be also riveted, welded or glued to the housing base 3. Advantageously, the circuit board 7 is mounted to the housing base 3, wherein the circuit board 7 is screwed to the housing base 3. Alternatively, the circuit board 7 can also be riveted, welded or glued to the housing base 3. Preferably, the housing cover 4 is tightly mounted to the housing base 3. Preferably, this can be performed in that the housing cover 4 is screwed, riveted, welded or alternatively glued to the housing base 3.

REFERENCE LIST

1 Control device
2 housing
3 Housing base
4 Housing cover
5 base
6 edge
7 Circuit board
8 Electronic component or antenna element
9 screw
10 section
11 Screw hole
12 Surface area
13 edge
14 groove
16 Plug connection element
17 Connector housing
18 contakt
19 opening
20 gasket
21 receiver
22 screw
23 Screw hole
24 Pressure compensation element
25 Plug receiver

The invention claimed is:

1. A control device comprising:
    a housing, the housing comprising:
        a housing base; and
        a housing cover selectively engageable with the housing base
    a circuit board including electronic components, the circuit board arranged between the housing base and the housing cover in the housing;
    a plug connection element selectively engageable with the housing base, the plug connection element including a connector housing; and
    an opening located at a bottom portion of the housing base covered by the connector housing and through which connection elements of the plug connection element are penetrable; and
    a pressure compensation element and a contact adjacent the pressure compensation element each positioned on a top portion of the connector housing for selective engagement with the bottom portion of the housing base via the opening in the bottom portion of the housing base when the plug connection element is selectively engaged with the housing base.

2. The control device according to claim 1 wherein the housing base consists of metal.

3. The control device according to claim 1 wherein the housing cover consists of plastic material.

4. The control device according to claim 1 wherein the housing cover consists of radome.

5. The control device according to claim 1 wherein the connector housing consists of plastic material.

6. The control device according to claim 1 wherein the connector housing is connected to the housing base.

7. The control device according to claim 1 wherein at least one of the connector housing and the housing base comprise a gasket receiver for receiving a gasket by means of which the connector housing is tightly mounted to the housing base.

8. The control device according to claim 7 wherein the gasket is designed in the form of an axial seal or radial seal.

9. The control device according to claim 1 wherein the pressure compensation element is designed in the form of an opening arranged in the connector housing and covered by a membrane.

10. The control device according to claim 1 wherein the membrane is connected to the connector housing by means of ultrasonic welding or gluing.

11. The control device according to claim 1 wherein the circuit board is arranged to be connected to the housing base.

12. The control device according to claim 1 wherein a sensor cover is tightly mounted to the housing base.

13. The control device according to claim 1 wherein the control device comprises a radar sensor.

14. A control device comprising:
- a housing, the housing comprising:
  - a metal housing base; and
  - a housing cover selectively engageable with the housing base
- a circuit board including electronic components, the circuit board arranged between the housing base and the housing cover in the housing;
- a plug connection element selectively engageable with the housing base, the plug connection element including a plastic connector housing; and
- an opening located at a bottom portion of the housing base covered by the connector housing and through which connection elements of the plug connection element are penetrable; and
- a pressure compensation element positioned on a top portion of the connector housing for selective engagement with the bottom portion of the housing base when the plug connection element is selectively engaged with the housing base.

* * * * *